United States Patent [19]

Wolley

[11] 3,909,119

[45] Sept. 30, 1975

[54] GUARDED PLANAR PN JUNCTION SEMICONDUCTOR DEVICE

[75] Inventor: Elden D. Wolley, Auburn, N.Y.

[73] Assignee: Westinghouse Electric Corporation, Pittsburgh, Pa.

[22] Filed: Feb. 6, 1974

[21] Appl. No.: 440,203

[52] U.S. Cl. .......................... 357/13; 357/20; 357/52

[51] Int. Cl.$^2$ H01L 29/90; H01L 29/06; H01L 29/34

[58] Field of Search .......................... 357/13, 20, 52

[56] References Cited

UNITED STATES PATENTS 3,663,874 5/1972 Fukukawa et al. .................. 357/13

*Primary Examiner*—Michael J. Lynch
*Assistant Examiner*—E. Wojciechowicz
*Attorney, Agent, or Firm*—C. L. Menzemer

[57] ABSTRACT

A semiconductor device with at least one planar PN junction is provided in a semiconductor body having at least one major surface. The body has first and second impurity regions of opposite conductivity type forming a first PN junction therebetween. The first impurity region is positioned adjoining the major surface, and the second impurity region is positioned in interior portions of the body adjoining the first impurity region. The second impurity region has an impurity concentration profile and thickness to support a space-charge region on application of a given reverse bias voltage across the PN junction.

A third impurity region is positioned in the semiconductor body adjoining the major surface around the first impurity region, and at least laterally encompassing the first and second impurity regions to form a second PN junction with the first impurity region, said second PN junction extending contiguously around the first PN junction and adjoining the major surface around and spaced from the second impurity region. The third impurity region has an impurity concentration profile and thickness to more than support the space-charge region formed at the second PN junction on application of said reverse bias voltage across the PN junction so that the blocking voltage of the device can be controlled by the avalanche breakdown and punch-through voltage at the second impurity region. For high voltage applications, field limiting rings can be positioned in the semiconductor body adjoining the major surface around and spaced from the second PN junction to form additional PN junctions with the third impurity region and to divide the electric field on application of a given applied voltage.

9 Claims, 10 Drawing Figures

GUARDED PLANAR PN JUNCTION SEMICONDUCTOR DEVICE

FIELD OF THE INVENTION

The present invention relates to semiconductor devices having planar PN junctions.

BACKGROUND OF THE INVENTION

The reverse breakdown voltages of planar junction devices are generally lower than devices with mesa junctions of the same background concentrations and doping profiles. This condition is caused in part by surface states and accompanying charge accumulation which causes the electric field at the surface of the junction to be higher than in the bulk of the semiconductor device. In addition, there is a radius of curvature at the edge of the junction which causes a higher electric field at the edge than in the bulk of the junction. See, e.g., Foster and Veloric, J. Appl. Phys., 30, 906–914 (1959); and Kao and Wolley, Proc. of IEEE, 55, 1409–1414 (1967).

The most common way of increasing the reverse breakdown voltage of planar PN junctions has been the use of a metallic field plate, see, e.g., Castrucci and Logan, IBM J., 8, 395–399 (1964); and Lepselter and Sze, BSTJ, 47, 195–208 (1968). The use of such field plates is shown in a planar PN diode device in FIG. 1. The field plate 3 is provided by extending the cathode electrode 2 outwardly over the edge of an insulator layer 4 beyond the PN junction 5. By this arrangement, the application of a reverse bias to the junction also applies the same potential to the field plate. The negative potential on the field plate then causes the semiconductor surface region under the insulator to deplete and extends the space-charge region of the device as shown by dotted line 6 in FIG. 1. A comparison of V-I responses of a planar PN junction diode, such as that shown in FIG. 1, with and without the field plate is shown in FIG. 2.

While field plates are effective in managing surface states and sharp curvatures in shallow PN junctions, crowding of the electric field particularly in deep PN junctions is still present at the outer periphery of the space-charge region as shown by line 6 in FIG. 1. These curvatures still restrict the breakdown voltage of such planar PN junction.

Therefore, to achieve high reverse breakdown voltages, it has been necessary to diffuse guard or field limiting rings into the semiconductor body around the planar PN junction. The guard rings 7 form PN junctions around the primary PN junction 5 as shown in FIG. 3 that operate to divide the electric field and in turn lower the maximum electric field for a given applied voltage, see, e.g., U.S. Pat. No. 3,391,267, granted July 2, 1968, and assigned to the same assignee as the present invention. The space-charge region thus formed is shown by the dotted line 8 in FIG. 3.

However, guard rings are difficult to fabricate for devices with moderate reverse breakdown voltages, i.e., 100 to 800 volts. The problem is that the spacing between guard rings becomes so narrow that standard photolithographic and etch procedures cannot be used for fabrication. Moreover, even with guard rings, the breakdown is likely to occur at the curvature (or perimeter) of the space-charge region, albeit at higher voltages. In such instances, localized breakdown will occur and thermal failure of the device occurs.

The present invention overcomes these difficulties and disadvantages of prior planar PN junctions. Specifically, it provides a guarded planar PN junction device with moderate breakdown voltages that can be easily fabricated with standard photolithographic techniques. Further, it provides a high voltage PN junction device which will avalanche substantially uniformly at the interior portion of the PN junction so that thermal failure of the device does not occur on avalanche.

SUMMARY OF THE INVENTION

A semiconductor device with at least one PN junction is provided in a semiconductor body such as a single-crystal silicon wafer having at least one major surface. The semiconductor body may be an epitaxially grown layer supported on a degenerate semiconductor substrate which is electrically conductive.

First and second impurity regions of opposite conductivity type are positioned in the semiconductor. The first impurity region adjoins the major surface, and the second impurity region adjoins the first impurity region interior of the body and forms a first PN junction therewith. The second impurity region has a sufficiently low impurity concentration profile and a sufficiently large thickness to support a space-charge region formed at the first PN junction on application of a given reverse bias voltage across the PN junction.

A third impurity region of opposite conductivity type from the first impurity region and of the same conductivity type as second impurity region is also positioned in the body. The third impurity region adjoins the major surface contiguously around the first impurity region and at least laterally contiguously around the first and second impurity regions in the interior of the body. The third impurity region thus forms a second PN junction contiguously around the first PN junction, which adjoins the major surface around and spaced from the second impurity region. The third impurity region has an impurity concentration profile and thickness such that the spacecharge region formed at the second PN junction on application of a given reverse bias voltage is greater than the space change region formed at the first PN junction. The blocking voltage of the semiconductor device can thereby be controlled by the avalanche breakdown or punch-through voltage at the second impurity region.

An electrode layer of electrically conductive material is disposed on the major surface of the body to make ohmic contact to the first impurity region. Preferably, an insulator layer of an electrically insulating material such as silicon dioxide or silicon nitride is formed on the major surface around the ohmic contact of the electrode layer to the major surface, and the electrode layer extends over the insulator layer around the second PN junction to extend the space-charge region of the PN junction at the major surface of the semiconductor body.

For very high voltage applications (e.g. 1,000 volts), the device is provided with field limiting rings as described in U.S. Pat. No. 3,391,287, granted July 2, 1968 and assigned to the same assignee as the present application. Specifically, at least one fourth impurity region may be disposed in the semiconductor body adjoining the major surface spaced around the second PN junction. Said fourth impurity region is of a conductivity type to form a PN junction with the third impurity region, and is spaced from the second PN junction a distance to improve the blocking voltage capability by dividing the space-charge region formed on application of a given reverse bias voltage.

In another embodiment, the device can be adapted for avalanche and IMPATT applications by providing a fourth impurity region of the same conductivity type as the second impurity region "buried" in the interior of the semiconductor body beneath the second impurity region. This fourth impurity region is a degenerate region of electrically conductive material, with the third impurity regions also laterally and contiguously therearound.

Preferably, the semiconductor body is in this embodiment an epitaxial layer formed on a supporting substrate of electrically conductive material. And the fourth impurity region adjoins the substrate and the second impurity region interior of the epitaxial layer. The second impurity region is thus provided with an impurity concentration profile and thickness less than a space-charge region extends therethrough on application of a given reverse bias voltage across the PN junction. The third impurity region still has an impurity concentration profile and thickness to support a space-charge region on application of said reverse bias across the PN junction.

Other details, objects and advantages of the invention will become apparent as the following description of the presently preferred embodiments thereof and the presently preferred methods for practicing the same proceeds.

BRIEF DESCRIPTION OF THE DRAWINGS

In the accompanying drawings, the presently preferred embodiments of the invention and presently preferred methods for making and practicing the same are shown, in which.

DESCRIPTION OF THE PREFERRED EMBODIMENTS

Figures 1, 3:
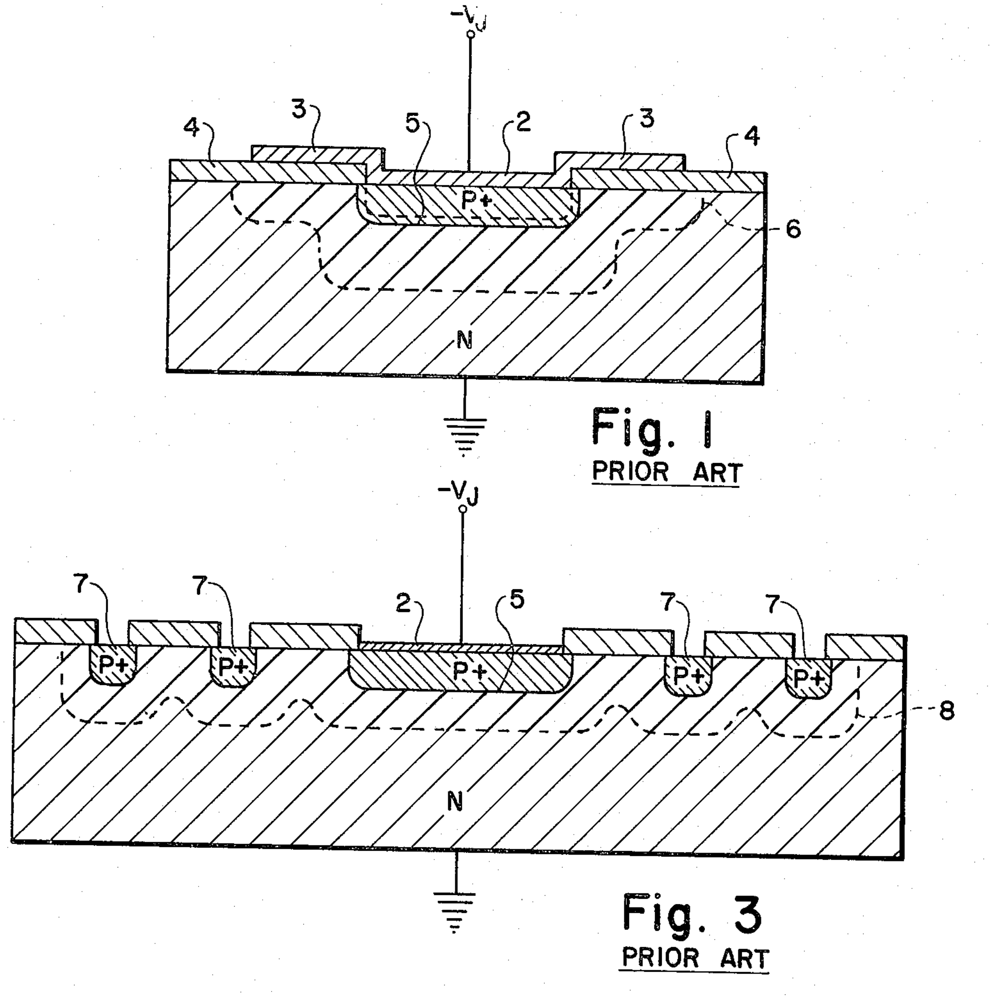
Fig. 1 PRIOR ART, Fig. 3 PRIOR ART
FIG. 1 is a cross-sectional view in elevation of a prior art diode with a planar PN junction and a field plate.
FIG. 3 is a cross-sectional view in elevation of a prior art diode with a planar PN junction and field limiting rings.
Figure 2:
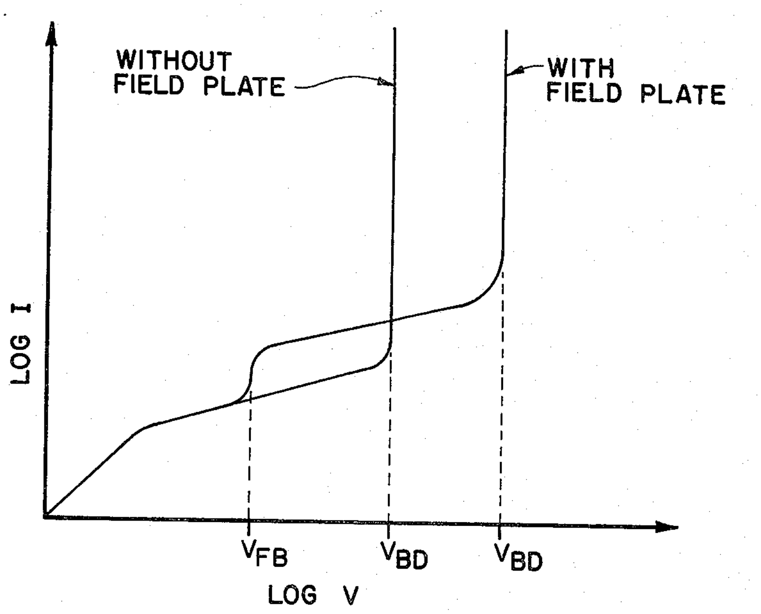
Fig. 2 PRIOR ART
FIG. 2 is a logarithmic graph of the voltage-current response of the prior art diode shown in FIG. 1, with and without the field plate.

Referring to FIGS. 1 through 3, prior art diodes with planar PN junctions are shown for purposes of comparative illustration. Specifically, the space-charge regions of diodes with field plates and field limiting rings are shown in FIGS. 1 and 3. FIG. 2 shows the voltage-current response of the prior art diode shown in FIG. 1, with and without the field plate. Further discussion of these prior art devices can be found by reference to the "Background of the Invention".

Figure 4:
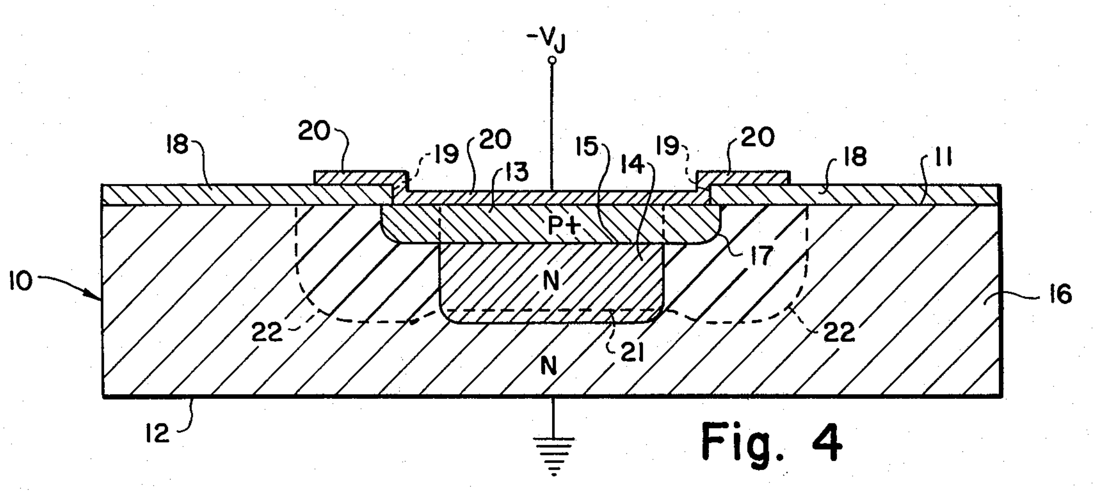
FIG. 4 is a cross-sectional view in elevation of a diode with a planar PN junction embodying the present invention.

Referring to FIG. 4, a planar PN junction diode is shown embodying the present invention. The diode is disposed in semiconductor body 10 having opposed major surfaces 11 and 12. Body 10 is typically a commercially available N-type silicon wafer with resistivity typically between about 1 and 200 ohm-cm and a thickness between about 5 and 25 mils.

First P-type impurity region 13 and second N-type impurity region 14 are sequentially diffused into selected areas of major surface 11 and body 10. First impurity region 13 is thus positioned in body 10 adjoining major surface 11, and a second impurity region 14 is positioned in interior portions of body 10 adjoining first impurity region 13 to form first PN junction 15 therewith. Concurrently, third N-type impurity region 16 is formed in body 10 by the residual N-type impurity originally grown into body 10. Third impurity region 16 adjoins major surface 11 contiguously around first impurity region 13 and laterally and axially encompasses first and second impurity regions 13 and 14. Third impurity region 16 and first impurity region 13 thus form second PN junction 17, which extends contiguously around first PN junction 15 and adjoins major surface 11 around and spaced from second impurity region 14.

The double diffusion is accomplished by first diffusing an N-type impurity into selected areas of major surface 11 to form in body 10 second N-type impurity region 14 adjoining major surface 11. The diffusion is typically performed by initially lapping or electropolishing major surface 11 of body 10 preparatory to diffusion. Thereafter, insulator layer 18 of an electrically insulating material such, for example, as silicon dioxide, silicon nitride, aluminum oxide or aluminum nitride, is formed on major surface 11 of body 10 to provide a suitable diffusion mask. The insulator layer is typically of silicon dioxide formed by heating the body 10 in an oxygen-rich atmosphere such as steam above 1100°C for about 60 minutes. Alternatively, silicon nitride may be similarly formed by heating the body in a silane-nitrogen atmosphere of about 850°C for about 15 minutes. Insulator layer 18 is also an element of the invention, as hereinafter described, and preferably has a thickness between 2,000 A and 20,000 A, with 10,000 A being most typical.

A window pattern (not shown), e.g., 20–100 mils in diameter, is then opened in insulator layer 18 to expose portions of major surface 11 suitable for selective diffusion of second N-type impurity region 14 into body 10. The window pattern is preferably opened by standard photolithographic and etch techniques. A suitable etchant for this purpose is buffered hydrofluoric acid.

Diffusion then takes place by heating the body 10 at about 1000°C in the presence of a gas or vapor of a compound containing the N-type impurity such as phosphine ($PH_3$), phosphorus trichloride ($PCl_3$), or phosphorus oxychloride ($POCl_3$). Phosphorus is thus deposited on the exposed portions of major surface 11 at the window pattern. Body 10 is thereafter heated, for example, at about 1200°C in an inert atmosphere such as argon for about 4 hours to drive the phosphorus into body 10 to provide a given substantially deep depth for second N-type impurity region 14. The diffusion may be similarly performed with vapors and gases, e.g. arsine ($AsH_3$), stibine ($SbH_3$), and halides and oxyhalides thereof, of other N-type impurities such as antimony and arsenic.

Thereafter, a P-type impurity is diffused into selected areas of major surface 11 to form in body 10 first P-type impurity region 13 of a given depth substantially less than the depth of second N-type impurity region 14. This second diffusion also limits second N-type impurity region 14 to the interior portions of body 10 by compensation doping of the surface regions, and forms, with second N-type impurity region 14, first PN junction 15.

The second diffusion is accomplished by opening window pattern 19, e.g., 25–105 mils in diameter, which is typically circular in shape, in the remaining insulator layer 18. Window pattern 19 is therefore larger than, and extends round the window pattern used for the diffusion of second impurity region 14. The window is opened preferably by standard photolithographic and etch techniques to expose selected portions of major surface 11 suitable for the diffusion of first impurity region 13.

The diffusion then takes place by heating the body 10 at about 1100°C in the presence of a gas or vapor of a compound containing the P-type impurity, such as boron oxide ($B_2O_3$), boron tribromide ($BBr_3$) or diborane ($B_2H_6$). Boron is thus deposited on the exposed portions of major surface 11 at window pattern 19. Body 10 is thereafter heated, for example, at about 1200°C in an inert atmosphere such as argon for about 2 hours to drive the boron into body 10 to a desired depth to form first P-type impurity region 13. The diffusion may be similarly performed with gases or vapors of other P-type impurities such as gallium or aluminum.

As previously noted, concurrently with the diffusion of impurity regions 13 and 14, third N-type impurity region 16 is formed by the residual impurity originally present in the silicon wafer as grown.

Figure 5:
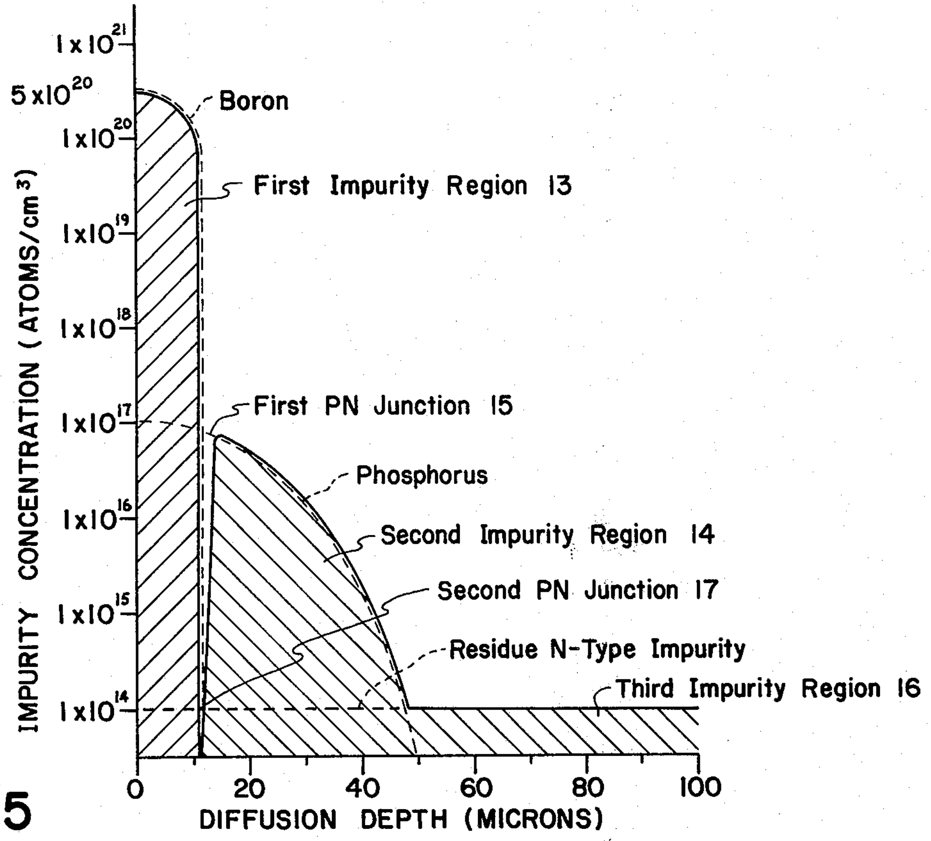
FIG. 5 is a graph showing the impurity concentration profile of the diode shown in FIG. 4.

The resulting diffusion concentration profile is shown in FIG. 5. The diffusions of first and second impurity regions 13 and 14 are adjusted so that second impurity region 14 in the interior of body 10 has a thickness and an impurity concentration profile to support a space-charge region formed therein on application of a given reverse bias voltage across PN junctions 15–17. To provide this thickness and impurity concentration profile, the diffusion of second impurity region 14 is preferably to a depth between 10 and 70 microns, with 50 microns being typical, and is preferably to a surface impurity concentration between $1 \times 10^{16}$ and $5 \times 10^{18}$ atoms/cm$^3$, with $1 \times 10^{17}$ atoms/cm$^3$ being typical. The diffusion of first impurity region 13 is then preferably to a depth between 5 and 20 microns, with about 10 microns being typical, and is preferably to a surface impurity concentration between $1 \times 10^{19}$ and $5 \times 10^{20}$ atoms/cm$^3$, with $5 \times 10^{20}$ atoms/cm$^3$ being typical.

As shown in FIG. 5, first PN junction 15 is formed between first impurity region 13 and second impurity region 14, and second PN junction 17 is formed between first impurity region 13 and third impurity region 16 peripherally of first PN junction 15. FIG. 5 also shows that the two PN junctions 15 and 17 are integral parts of the same PN junction so that a potential applied across one of the junctions is applied equally across both junctions.

The residual uniform impurity concentration and thickness of body 10 is sufficient, as above given, so that second PN junction 17 has a greater avalanche breakdown and punch-through voltages than first PN junction 15. Stated another way, third impurity region 16 also has a thickness and an impurity concentration profile such that the space-charge region formed at second PN junction 17 on application of said given reverse bias voltage across the PN junctions 15–17 is greater than the space charge region formed at first PN junction 15. To provide this, third impurity region 16 preferably has a resistivity at least 2 times greater than the average resistivity of second impurity region 14.

Electrode layer 20 of an electrically conductive material such as gold, silver, platinum, aluminum, chromium, tin, nickel or indium is then deposited on major surface 11 of body 10 at window pattern 19 to make ohmic contact to first P-type impurity region 13. Further, electrode layer 20 preferably extends to cover portions of insulator layer 18 around PN junction 15–17 to extend the space-charge region at major surface 11 adjoining the PN junction. Layer 20 is typically formed by vapor or sputter deposition through a suitable metallic deposition mask, or by indiscriminately forming a metal layer over the exposed portions of the structure and selectively removing the metal layer with standard photolithographic and etch techniques. The thickness of electrode layer 20 is typically between 2,000 and 10,000 A, depending upon the power requirements of the device.

Generally the diode is subsequently passivated against atmospheric effects by depositing another insulating layer (not shown) over the structure. Examples of such compositions for passivating are silicon dioxide, silicon monoxide, aluminum oxide, silicone resins and epoxy resins, which provide essentially air tight, electrically insulating coatings.

In operation, a junction voltage ($V_J$) is applied to electrode layer 20. The same potential is thus applied across both first and second PN junctions 15 and 17. The space-charge region in third N-type impurity region 16 extends deeper into body 10 than the space-charge region in second impurity region 14 because of the lower impurity concentration and greater thickness of third impurity region 16.

The configuration of the space-charge region thus formed is shown by dotted line 21 in FIG. 4. Bulge 22, formed as the space-charge region, extends from the second N-type impurity region 15 into third N-type impurity region 16, and increases considerably the breakdown voltage. First the inside radius of the boundary of the space-charge region adjacent second impurity region 14 causes a spreading of the electric field. Second, the curvature of the boundary of the space-charge region at the outer periphery of PN junction 17 is increased and, because the radius of the curvature of the space-charge region is large, crowding of the electric field is minimized. The reverse blocking voltage of the diode is thus controlled by the avalanche breakdown or punch-through voltage at second N-type impurity region 14.

Figure 6:
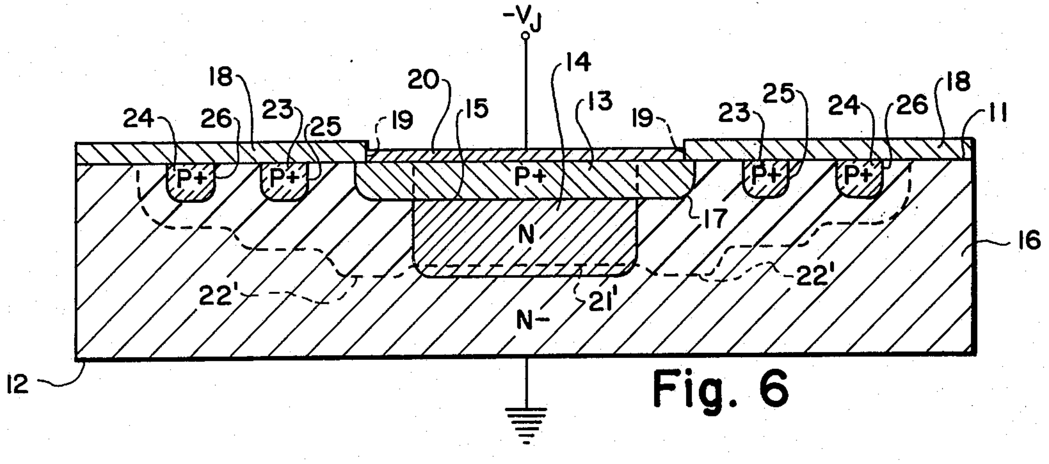
FIG. 6 is a cross-sectional view in elevation of a second diode with a planar PN junction embodying the present invention.

Referring to FIG. 6, a second planar PN junction diode is shown in accordance with the present invention. The structure is the same as that shown and described in connection with FIG. 4 except that, additionally, annular P+ type impurity regions 23 and 24 are diffused into body 10 through major surface 11 around first P-type impurity region 13 and form PN junctions 25 and 26, respectively, with third N-type impurity region 16. The diode thus includes field limiting rings as more fully described in U.S. Pat. No. 3,391,267, granted July 2, 1968 and assigned to the same assignee as the present invention.

This embodiment is particularly useful in providing a reverse blocking PN junction for high voltage applications. The field limiting rings 23 and 24 operate to divide the electric field of the space-charge region and thus lower the maximum electric field for a given applied junction voltage. The configuration of the space-charge region is thus extended as shown by dotted line 21' on FIG. 6.

Figure 7:
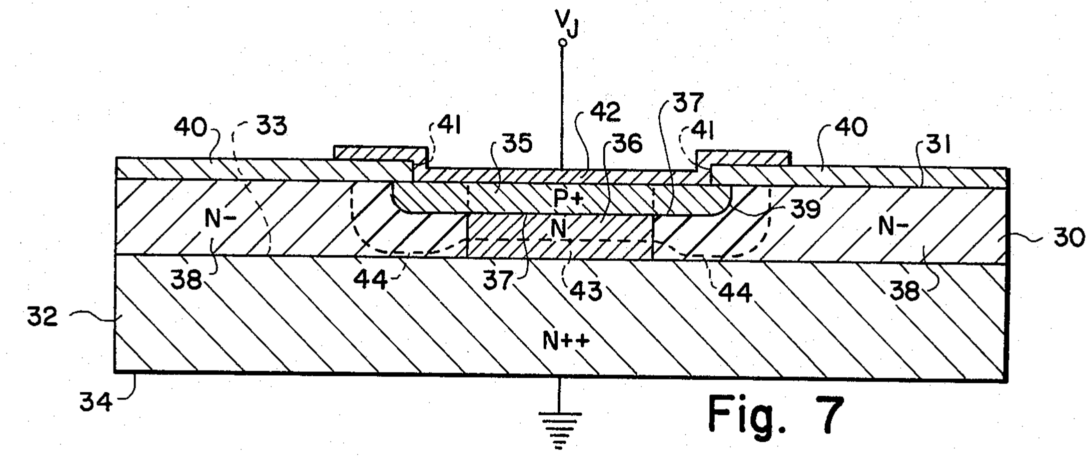
FIG. 7 is a cross-sectional view in elevation of a third diode with a planar PN junction embodying the present invention.

Referring to FIG. 7, a third planar PN junction diode is shown in accordance with the present invention. The diode is disposed in epitaxially grown semiconductor layer 30 having major surface 31. Epitaxial layer 30 is grown on semiconductor substrate 32 having opposed major surfaces 33 and 34. Substrate 32 is typically a commercially available degenerate N-type silicon wafer having a resistivity preferably less than about 0.01 ohm-cm and a thickness preferably of about 3 to 20 mils.

Substrate 32 is prepared for epitaxial growth preferably by first mechanically and chemically processing at least major surface 33 so that the surface is crystallographically oriented in the [100] cyrstallographic plane or 2° off from the [111] crystallographic plane of the single crystal silicon. Substrate 32 and particularly major surface 33 is then cleaned by any one of the well known cleaning techniques. For example, substrate 32 and particularly major surface 33 may be cleaned by degreasing in acetone and tetrachloroethylene and thereafter boiling in sulfuric-nitric acid ($H_2SO_4$:-$HNO_3$;3:1). Substrate 32 may then be chelated using ammonium ethylenediaminetetracetate, which is a complexing agent for removing metal ions from the substrate surface. After degreasing, boiling and chelating, the substrate is rinsed extensively in Super-Q water, i.e., continuously recycled deionized water.

Following an in situ hydrogen chloride etch, N-doped silicon layer 30 is then epitaxially grown on major surface 33 of silicon substrate 32. The epitaxial growth is preferably performed in a horizontal reactor with an external RF induction heater at a temperature between 1100°–1250°C. Silicon is, for example, deposited from silicon tetrachloride ($SiCl_4$) in hydrogen carrier gas. The impurity is introduced into the system as a gas of a compound containing the N-type impurity, such as phosphine ($PH_3$), stibine ($AbH_3$) or arsine ($AsH_3$), to substantially uniformly dope the epitaxial layer.

Epitaxial layer 30 typically has an impurity concentration typically between about $1 \times 10^{14}$ and $1 \times 10^{15}$ atoms/cm$^3$ and a resistivity typically between about 5 and 50 ohm-cm. The epitaxial layer is continued until the layer contains a thickness greater than about 10 microns and typically of about 50 microns. The thickness of semiconductor layer 30 is, of course, determined by the width of the space-charge region on application of a given reverse blocking voltage to the device as herein described.

First P-type impurity region 35 and second N-type impurity 36 are sequentially diffused into selected areas of major surface 31 of semiconductor layer 30. First impurity region 35 is thus positioned in layer 30 adjoining major surface 31, and second impurity region 36 in interior portions of layer 30 adjoining first impurity region 35 to form first PN junction 37 therewith. Concurrently, third N-type impurity region 38 is formed in layer 30 by the N-type impurity originally grown in layer 30 adjoining major surface 31 contiguously around first impurity region 35 and laterally encompassing first and second impurity regions 35 and 36 through semiconductor layer 30. Third impurity region 38 and first impurity region 35 thereby form second PN junction 39, which extends contiguously around first PN junction 37 and adjoins major surface 31 around and spaced from second impurity region 35.

The double diffusion is accomplished by first diffusing an N-type impurity into selected areas of major surface 31 to form through epitaxial layer 30 a second N-type impurity region 36. Specifically, the diffusion is accomplished by forming insulator layer 40, such as silicon dioxide or silicon nitride to provide a suitable diffusion mask for the subsequent diffusion. Typically, the insulator layer is formed of silicon dioxide by heating the structure in an oxygen-rich atmosphere such as steam above 1100°C for about 60 minutes. Insulator layer 36 is also an element of the invention as hereinafter described, and is preferably between 2,000 A and 20,000 A in thickness, with about 5,000 A being typical.

Thereafter a window pattern (not shown) is opened in insulator layer 40 to expose portions of major surface 31 suitable for selective diffusion of second N-type impurity region 36 into layer 30. The window pattern is preferably opened by standard photolithographic and etch techniques. Subsequently, diffused into and through semiconductor layer 30 is an N-type impurity such as phosphorus, arsenic or antimony by a standard diffusion technique, as above described, to form N-type impurity region 36 through semiconductor layer 30.

A P-type impurity is then diffused into selected portions of major surface 11 to form in body 10 first P-type impurity region 35. First impurity region 35 thus adjoins major surface 31 and restricts second N-type impurity region 36 to the interior portions of semiconductor layer 30. Further, first impurity region 35 simultaneously forms first PN junction 37 with second impurity region 36 in the interior portion of the layer 30.

The diffusion is preferably accomplished by first opening window pattern 41 which is typically circular in shape, in remaining insulator layer 14 around the window pattern used for diffusion of second impurity region 36. Thus, the window pattern is larger than the window pattern for diffusion of region 35 and is typically opened by standard photolithographic and etch techniques. Selected portions of major surface 31 corresponding to the surface areas selected for diffusion of the P-type impurity are thereby exposed. A P-type impurity such as boron, gallium or aluminum is then diffused into the exposed portions of major surface 31 through window pattern 41 by standard diffusion techniques as above described.

Concurrently with the diffusion of first P-type impurity region 35 and second N-type impurity region 36, third N-type impurity region 38, as above described, is formed by the original impurity concentration grown in semiconductor layer 30 during its epitaxial growth.

The diffusions of first and second impurity regions 35 and 36 are adjusted so that second impurity region 36 in the interior of layer 30 has a thickness and an impurity concentration profile to support a space-charge region formed therein on application of a given reverse bias voltage across PN junctions 37–39. To provide this thickness and impurity concentration profile, the diffusion of second impurity region 36 is preferably through semiconductor layer 30, i.e., greater than 10 and typically about 50 microns, and preferably has a surface impurity concentration between about $1 \times 10^{16}$ and $5 \times 10^{18}$ atoms/cm$^3$, with $1 \times 10^{17}$ atoms/cm$^3$ being typical. The diffusion of first impurity region 35 is then preferably to a depth between about 5 and 20 microns, with about 10 microns being typical, and is preferably to a surface impurity concentration between about $1 \times 10^{19}$ and $5 \times 10^{20}$ atoms/cm$^3$, with $5 \times 10^{20}$ atoms/cm$^3$ being typical.

Similarly, the original impurity concentration and thickness of semiconductor layer 30, as epitaxially grown, is sufficient so that second PN junction 39 has avalanche breakdown and punch-through voltages greater than first PN junction 37. Stated another way, third impurity region 38 also has an impurity concentration profile and thickness greater than the space-charge region formed at second PN junction 39 on application of a given reverse bias voltage across PN junction 37–39.

Electrode layer 42 of an electrically conductive material, such as above described, is then deposited on major surface 31 of layer 30 at window pattern 41 to make ohmic contact to first P-type impurity region 35. Further, electrode layer 42 preferably extends to cover portions of insulator layer 40 around PN junction 39 to extend the space-charge region at major surface 31 adjoining the PN junction. Layer 40 is typically formed by vapor or sputter deposition through a suitable metallic deposition mask, or by vapor or sputter deposition over the exposed portions of the structure and selective removal of the metal layer by standard photolithographic and etch techniques. The thickness of the electrode layer 42 is typically between 2,000 and 10,000 A, depending upon the power requirements for the device.

In operation, the application of a reverse bias voltage across the PN junctions 37–39 produces a space-charge region in second and third N-type impurity regions 36 and 38 having a configuration as shown by dotted line 43 in FIG. 7. Bulge 44 in the space-charge region, which extends from second N-type impurity region 36 into third N-type impurity region 38, increases considerably the breakdown voltage of the diode. First, the inside radius at the boundary of the space-charge region adjacent the second N-type impurity region 36 causes a spreading of the electric field. Second, the curvature of the space-charge region at the periphery is increased so that crowding of the electric field is reduced. The blocking voltage of the diode is typically controlled by the avalanche breakdown at bulge 44.

Figure 8:
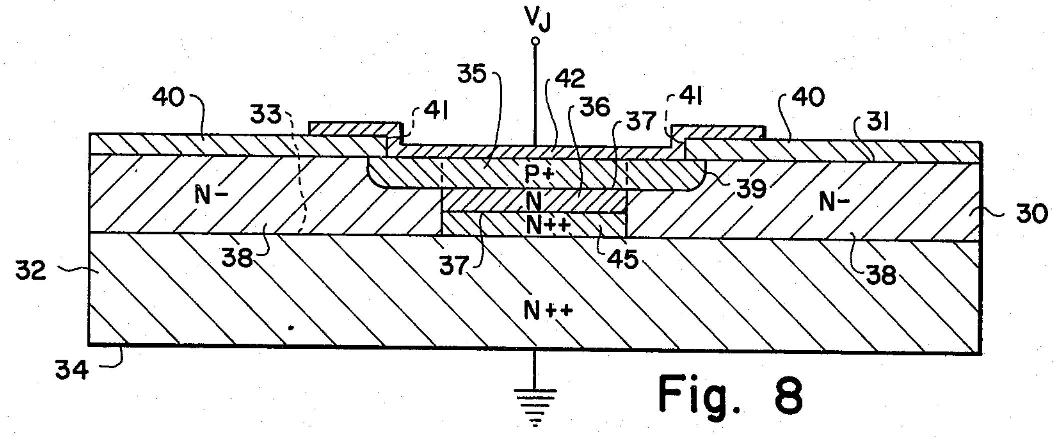
FIG. 8 is a cross-sectional view in elevation of a fourth diode with a planar PN junction embodying the present invention.

Referring to FIG. 8, a fourth planar PN junction diode is shown similar to that shown in FIG. 7. This diode, however, has the blocking voltage controlled by the avalanche breakdown or punch-through voltage at second impurity region 36 by providing a fourth highly conductive N++-type impurity region 45 (e.g. resistivity of 0.01 ohm-cm) in semiconductor layer 30 under second impurity region 36. The structure is the same as that shown and described in connection with FIG. 7 except for the addition of fourth N++-type impurity region 45. Further, the fabrication is the same as that shown and described in connection with FIG. 7 except for the method of fabrication of fourth N++-type impurity region 45 and second N-type impurity region 36.

In this embodiment, N++-type impurity region 45 and second N-type impurity region 36 are, however, sequentially grown by selective epitaxy. First, an epitaxial masking layer (not shown) such as silicon dioxide is formed on major surface 31 by heating the structure in an oxygen-rich atmosphere, as above described. Second, a suitable resist layer (not shown) is formed over the epitaxial masking layer. A window pattern (not shown) is then opened in the resist layer and the epitaxial masking layer by photolithographic and etch techniques to exposed portions of major surface 33 of body 32, that correspond to impurity regions 36 and 45.

Third, N++-type impurity region 45 is then epitaxially grown over the exposed portions of major surface 33 by selective epitaxy. The N++-type silicon layer may have a thickness of only 5 microns to provide a blocking voltage controlled by the punch-through voltage at second N-type impurity region 36. However, for an IMPATT or avalanche device, as hereafter described, a thickness greater than 10 microns and preferably about 2 to 5 microns less than semiconductor layer 30 is provided. N++-type silicon layer 45 also has an impurity concentration providing an electrically conductive region preferably of about the same resistivity as substrate 32, i.e. typically less than about 0.01 ohm-cm.

Preferably the selective epitaxy is performed by one of the methods described by P. Rai-Choudhury and D. K. Schroder in their article entitled "Selective Growth of Epitaxial Silicon and Germanium Arsenide", J. Electrochem. Soc., 118, 107 (1971). That is, epitaxial growth is inhibited on a masking over semiconductor layer 30 which reacts the depositing or arriving reactants to form volatile products such as silicon monoxide or by introducing into the system addition species, such as hydrogen chloride gas, which will prevent absorption of reactants preferentially on the masking layer. For example, when pyrolysis of monosilane ($SiH_4$) is used for the epitaxial growth, hydrogen ($H_2$) carrier gas and relatively high deposition temperatures (greater than 1200°C) are used to provide proper growth conditions to prevent epitaxial growth on the silicon dioxide layer. Alternatively, when silicon tetrachloride ($SiCl_4$) vapor in hydrogen ($H_2$) carrier gas is used for the epitaxial growth, hydrogen chloride (HCl) gas is input to the system to control the partial pressure of hydrogen chloride in the system and prevent epitaxial growth on the silicon dioxide layer. The N-type impurities are provided in epitaxial layers 45 and 36 by inputting a gas such as phosphine ($PH_3$) or arsine ($AsH_3$) to the system, or vaporization of phosphorus or arsenic halides or oxyhalides (e.g. $PCl_3$, $PBr_3$, $AsCl_3$, $AsBr_3$or $POCl_3$).

N-type impurity region 36 is then epitaxially grown on the N++-type layer by the same selective epitaxialy technique. For an IMPATT or avalanche device, the N-type silicon layer of a substantially uniform doping therethrough is grown to a thickness less than the space-charge region formed on application of a given reverse bias voltage to the completed PN junction. Second impurity region 36 is thus provided with a substantially uniform thickness of less than 10 microns and preferably of about 2 to 5 microns.

The combined thickness of N++-type impurity layer 45 and N-type impurity layer 36 preferably corresponds in thickness to the epitaxially grown layer 30. To smooth the surface 31, it may be appropriate to lap etch the structure after completion of the selective epitaxy.

After the selective epitaxy, the epitaxial mask is removed, and insulator layer 40 of an electrically insulating material is formed on major surface 31 of semiconductor layer 30. The insulator layer is typically of silicon dioxide formed by heating the structure in an oxygen-rich atmosphere such as steam above 1100°C for about 60 minutes. Thickness of insulator layer 40 is typically between 2,000 A and 20,000 A, with 10,000 A being most usual.

Window pattern 41 is then opened in insulator layer 40 by standard photolithographic and etch techniques to expose selective areas suitable for the selective diffusion of first P-type impurity region 35. Window pattern 41 thus exposes surface portions of second N-type impurity region 36 and of third N-type impurity region 38 surrounding region 36. Thereafter, a P-type impurity is diffused into selective portions of major surface 31 through window pattern 41 to form first impurity region 35 and to drive, by compensation doping, second impurity region 36 into the interior portions of semiconductor layer 30.

It should also be noted that concurrently with the selective epitaxial growth and subsequent diffusion, third N-type impurity region 38 is formed by the original doping grown into semiconductor layer 30 laterally and contiguously around first P-type impurity region 35, second impurity region 36 and fourth N++-type impurity region 45.

The remainder of the diode is then fabricated as above described in connection with FIG. 7. As noted, this embodiment is particularly useful in such applications as avalanche and IMPATT diodes. The narrow thickness and the high doping concentration of second impurity region 36 is substantially uniform at less than 10 microns and at a concentration of about $1 \times 10^{15}$ to $1 \times 10^{16}$ atoms/cm$^3$ to provide the "trapped plasma" mode for IMPATT operation. Because of the large width and large curvature of the space-charge region in the third N-type impurity region 38 around second N-type impurity region 36, the blocking voltage is controlled by the punch-through voltage at second N-type impurity region 36, and the diode will punch-through substantially uniformly over the width of second N-type impurity region 36. The improved stable operation of the diode is sufficient to justify the added complexity in fabrication.

Figure 9:
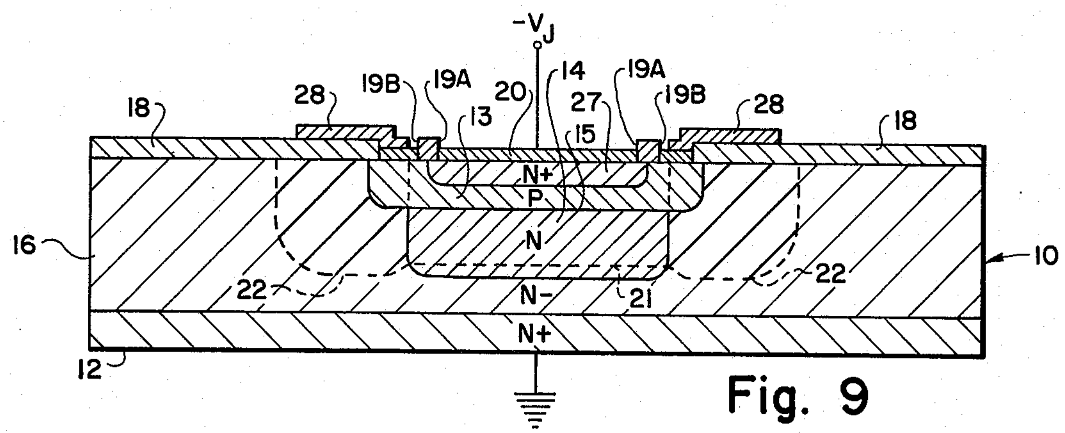
FIG. 9 is a cross-sectional view in elevation of a transistor with a planar PN junction embodying the present invention.

Referring to FIG. 9, a transistor is shown with a planar PN junction employing the present invention. The structure is essentially the same as above described and shown in connection with FIG. 4 except for the addition of N+-type impurity region 27 to provide an emitter region, and a base electrode 28 to provide a drive signal for the transistor.

Specifically, after diffusion of first and second impurity region 13 and 14, insulator layer 18 is then regrown to close window pattern 19 by again heating body 10 in an oxygen-rich atmosphere as above described. Window pattern 19A is then opened in regrown insulator layer 18 by standard photolithographic and etch techniques to expose selected portions of major surface 11. Then diffused into body 10 through window pattern 19A is an N-type impurity to form N+-type impurity 27. Preferably, also simultaneously diffused through major surface 12 is an N-type impurity to form an N+-type impurity region adjoining surface 12, as shown, to lower saturation voltage of the collector region.

Annular window pattern 19B is then opened in insulator layer 18 to expose selected portions of major surface 11 adjoining first P-type impurity region 15 by standard photolithographic and etch techniques. Electrode layers 20 and 28 of an electrically conductive material are then deposited through window patterns 19A and 19B, respectively, to make ohmic contact to N+-type impurity region 27 and P-type impurity region 13, respectively. Layers 20 and 28 provide the emitter and base electrodes for the transistor. A supporting metal contact (not shown) is then typically applied and alloyed to major surfaces 12 to provide a collector electrode and complete the transistor.

Referring to FIG. 9, a thyristor is shown with a planar PN junction employing the present invention. The structure is essentially the same as above described and shown in connection with FIG. 6 except for the addition of P-type impurity region 29 to provide the anode-emitter region, and N+-type impurity region 27' to provide the cathode-emitter region for the thyrisor. Preferably, P-type impurity region 29 is diffused simultaneously with first P-type impurity region 13 and field limiting rings 23 and 24. Thereafter, insulator layer 18 is regrown; annular window pattern 19B' opened and N+-type impurity region 27' diffused into body 10 to form the cathode-emitter region. Cathode electrode 28' and gate electrode 20' are then simultaneously formed as above described in connection with FIG. 8 to complete the thyristor structure.

Figure 10:
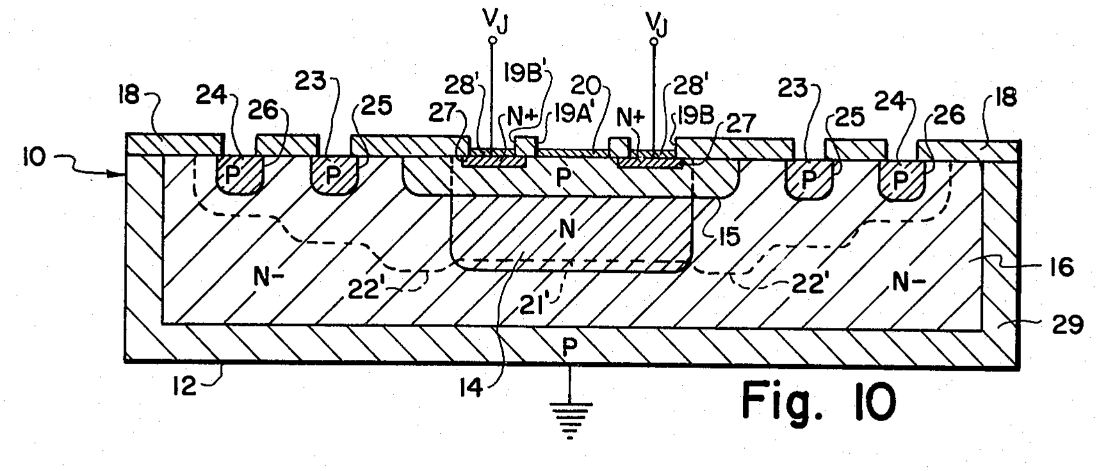
FIG. 10 is a cross-sectional view in elevation of a thyristor with a planar PN junction embodying the present invention.

In operation, the transistor and the thyristor shown in FIGS. 9 and 10 adjoin the PN junctions 15–17 with high reverse blocking capability. On application of a reverse bias junction voltage to emitter or cathode electrode, portions of the second and third impurity regions 14 and 16 are depleted to form a space-charge region. The configuration of the space-charge region is shown by dotted line 21 on FIG. 9 and dotted line 21' on FIG. 10. Bulge 22 or 22' in the space-charge region in third N-type impurity region 16 causes the blocking voltage of the transistor or thyristor to be controlled by the avalanche breakdown or punch-through voltage at second N-type impurity region 14. The thyristor structure shown in FIG. 10 includes field limiting rings to increase the voltage capability of the device.

While the preferred embodiments of the invention have been shown and described with particularity, it is distinctly understood that the invention may be otherwise variously embodied and utilized within the scope of the following claims.

What is claimed is:

1. A semiconductor device with at least one planar PN junction comprising:

A. a semiconductor body having at least one major surface;

B. a first impurity region of a given conductivity type positioned in the body adjoining selected portions of the major surface;

C. a second impurity region of opposite conductivity type from the first impurity region positioned in interior portions of the body adjoining the first impurity region to form a first PN junction therewith, said second impurity region having a lower impurity concentration than said first impurity region and a thickness to support a space-charge region on application of a given reverse bias voltage across said first PN junction;

D. a third impurity region of opposite conductivity type from the first impurity region positioned in the body adjoining the major surface around and adjoining the first impurity region and at least laterally contiguously around the first and second impurity region to form a second PN junction with the first impurity region, said second PN junction extending contiguously from said first PN junction to adjoin the major surface around and axially spaced from the second impurity region;

E. said third impurity region having an impurity concentration profile and thickness to more than support the space-charge region formed at the second PN junction on application of said given reverse bias voltage across said second PN junction; and F. an electrode layer of electrically conductive material disposed on the major surface of the body and making ohmic contact with the first impurity region.

2. A semiconductor device with at least one planar PN junction as set forth in claim 1 wherein:

the impurity concentration profile of the third impurity region is substantially uniform, and the resistivity of the third impurity region is at least two times greater than the average resistivity of the second impurity region.

3. A semiconductor device with at least one planar PN junction as set forth in claim 1 comprising in addition:

G. a fourth impurity region positioned in the semiconductor body adjoining the major surface around and spaced from the second PN junction, said fourth impurity region being of opposite conductivity type from the third impurity region and forming a third PN junction with the third impurity region.

4. A semiconductor device with at least one planar PN junction as set forth in claim 1 comprising in addition:

G. an insulator layer of an electrically insulating material positioned on the major surface of the semiconductor body around said electrode layer; and H. an extension portion of said electrode layer extending from said electrode layer over the insulator layer and the second PN junction to axially extend a space charge region of the second PN junction at the major surface of the semiconductor body.

5. A semiconductor device with at least one planar PN junction as set forth in claim 1 wherein:

the impurity concentration profile of the third impurity region is substantially uniform, and the resistivity of the third impurity region is at least two times greater than the average resistivity of the second impurity region.

6. A semiconductor device with at least one planar PN junction comprising:

A. a degenerate semiconductor substrate capable of electrically conducting;

B. an epitaxial semiconductor layer formed on said major surface of the semiconductor substrate to form a semiconductor body having a major surface;

C. a first impurity region of a given conductivity type positioned in the epitaxial layer adjoining selected portions of said major surface.

D. a second impurity region of opposite conductivity type from the first impurity region positioned in interior portions of the epitaxial layer adjoining the first impurity region to form a first PN junction therewith, said second impurity region having a lower impurity concentration than said first impurity region and a thickness to support a space-charge region on application of a given reverse bias voltage across said first PN junction;

E. a third impurity region of opposite conductivity type from the first impurity region positioned in the epitaxial layer adjoining said major surface around and adjoining the first impurity region and at least laterally contiguously around the first and second impurity region through the epitaxial layer to form a second PN junction with the first impurity region, said second PN junction extending contiguously from said first PN junction to adjoin said major surface around and axially spaced from the second impurity region;

F. said third impurity region having an impurity concentration profile and thickness to more than support the space-charge region formed at the second PN junction on application of said given reverse bias voltage across said second PN junction; and G. an electrode layer of electrically conductive material disposed on said major surface of the epitaxial layer making ohmic contact with the first impurity region.

7. A semiconductor device with at least one planar PN junction as set forth in claim 6 wherein:

the impurity concentration profile of the third impurity region is substantially uniform, and the resistivity of the third impurity region is at least two times greater than the average resistivity of the second impurity region.

8. A semiconductor device with at least one planar PN junction as set forth in claim 6 wherein:

said second impurity region extends through the epitaxial layer from said first PN junction to the major surface of the semiconductor substrate.

9. A semiconductor device with at least one planar PN junction as set forth in claim 6 comprising in addition:

H. a further highly conductive impurity region of the same conductivity as the second impurity region in the interior portions of the epitaxial layer extending between and adjoining the second impurity region and the major surface of the semiconductor substrate.

* * * * *